(12) United States Patent
Montrose

(10) Patent No.: US 6,437,956 B1
(45) Date of Patent: Aug. 20, 2002

(54) CIRCUIT FOR BIPOLAR TRANSISTOR STRESS AND QUALIFICATION

(75) Inventor: Charles J. Montrose, Clintondale, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 09/590,993

(22) Filed: Jun. 9, 2000

(51) Int. Cl.[7] .................................................. H02H 9/00
(52) U.S. Cl. .......................... 361/56; 361/54; 361/111; 327/538; 327/543; 327/432; 327/310
(58) Field of Search .............................. 361/56, 54, 111; 323/304, 311, 907; 327/524, 520, 538, 543, 309, 310, 323, 411, 432

(56) References Cited

U.S. PATENT DOCUMENTS

| 4,728,901 A | * | 3/1988 | Pepper ........................ 323/273 |
| 4,750,078 A | * | 6/1988 | Ganger et al. .............. 257/360 |
| 4,992,836 A | * | 2/1991 | Sicard ........................ 257/500 |

FOREIGN PATENT DOCUMENTS

JP          07-222343       *   8/1995

OTHER PUBLICATIONS

Horowitz, P., Hill, W., "The Art of Electronics" (Second Edition); Chapter 4, pp. 175–182, (No Date).

* cited by examiner

Primary Examiner—Kim Huynh
(74) Attorney, Agent, or Firm—Ratner & Prestia; Tiffany L. Townsend, Esq.

(57) ABSTRACT

A stress-driver circuit for providing a constant voltage ($V_{ce}$) and a constant current ($I=V_{in}/R$) to a bipolar transistor under test. The circuit includes a power source, an op-amp, a FET, and the bipolar transistor. The power source is connected to the bipolar transistor collector. The op-amp has a positive input biased at input voltage ($V_{in}$) and a negative input having a feedback loop connected to the bipolar transistor emitter. The op-amp output is connected to the FET gate, the FET drain is connected to the power supply, and the FET source is biased to ground through a first resistor and connected to the base of the bipolar transistor. The second resistor is connected at one end to the bipolar transistor emitter and biased to ground at the other end. An automatic trip circuit may be provided to cut off power to the bipolar transistor if the current at the bipolar transistor collector exceeds a predetermined value. One or more parameter readback circuits may be provided in predetermined areas of the stress-driver circuit, each readback circuit providing a readout of current, voltage, or both.

15 Claims, 4 Drawing Sheets

US 6,437,956 B1

CIRCUIT FOR BIPOLAR TRANSISTOR STRESS AND QUALIFICATION

TECHNICAL FIELD

The present invention relates generally to the manufacture of bipolar transistors and, more specifically, to the testing of developmental bipolar transistors under controlled stress conditions to provide qualification for commercial use.

BACKGROUND OF THE INVENTION

Transistors are used as either amplifying or switching devices in electronic circuits. In the first application, the transistor functions to amplify small ac signals. In the second application, a small current is used to switch the transistor between an "on" state and an "off" state.

An "FET" is a field effect transistor. There are two major types of FET's, the metal-oxide-semiconductor field effect transistor or MOSFET (also called an insulated-gate FET, or IGFET), and the junction-gate FET, or JFET. An FET has a control gate, and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

The bipolar transistor is an electronic device with two p-n junctions in close proximity. The bipolar transistor has three device regions: an emitter, a collector, and base disposed between the emitter and the collector. Ideally, the two p-n junctions (the emitter-base and collector-base junctions) are in a single layer of semiconductor material separated by a specific distance. Modulation of the current flow in one p-n junction by changing the bias of the nearby junction is called "bipolar-transistor action."

External leads can be attached to each of the three regions and external voltages and currents can be applied to the device using these leads. If the emitter and collector are doped n-type and the base is doped p-type, the device is an "npn" transistor. Alternatively, if the opposite doping configuration is used, the device is a "pnp" transistor. Because the mobility of minority carriers (i.e., electrons) in the base region of npn transistors is higher than that of holes in the base of pnp transistors, higher-frequency operation and higher-speed performances can be obtained with npn devices. Therefore, npn transistors comprise the majority of bipolar transistors used to build integrated circuits.

In the manufacture of bipolar transistors, especially in the development of new bipolar transistor technology such as SiGe bipolar transistors, it is often necessary to put various populations of bipolar transistors under controlled stress conditions to qualify the transistors for commercial use. Presently, such transistors are stressed by exposing them to stress conditions that provide an approximation of constant current, constant voltage conditions for a predetermined time at a stress temperature. The stress conditions are determined for each application, but include parameters such as stress current, stress voltage, stress temperature, and stress duration. The stress temperature is typically provided by putting the transistor under stress in a stress oven.

A typical stress driver circuit 400 is shown in FIG. 1. Stress conditions are applied by increasing the voltage 11 until the desired emitter current is reached. The transistor bias is provided by resistors 410 and 420. The emitter current is determined by measuring the voltage drop across resistor 22. A plurality of such circuits connected to a single voltage source for stressing a plurality of transistors are typically provided. Because the stress conditions depend on the characteristics of the transistor 18 under stress, the stress conditions will change as the characteristics of the transistor 18 change under stress. Also, each of the plurality of transistors will be under somewhat different stress conditions because each transistor typically has somewhat different characteristics.

Typically, after exposing the plurality of transistors to the predetermined stress conditions for a predetermined time, the stress conditions are removed, and the transistors are physically moved from the stress oven to a parametric tester for characterization. This characterization is done to measure any degradation of the transistor device parameters over the course of the stress testing. The transistors are then returned to the stress oven, and the procedure is repeated until the transistors have received the total predetermined amount of stress.

The standard testing method does not include "in situ" data collection while the transistors are under stress. There is some concern among those skilled in the art that characterizing a transistor after the stress conditions have been removed (and after the transistor has been physically handled) may provide some relaxation of the response of the transistor to stress. Therefore, the characterization performed after the stress has been interrupted may not portray a true picture of the response of the transistor to stress.

Furthermore, the standard stress driver circuit 400 does not provide for disconnection of the transistor upon failure. This shortcoming may cause the transistor to draw excessive current, which in turn may cause two problems. First, the excessive current draw from voltage source 11 in FIG. 1 may affect the stress conditions of the other transistors in the plurality of test circuits, especially if a number of them begin to fail. Second, the failing transistor may draw enough current that it causes an excessive amount of physical damage to itself. This damage would render the part useless to post-stress physical failure analysis. The analysis of a transistor that has "burned out" does not provide useful information as to the mechanism of the failure. Accordingly, the standard method fails to provide a full understanding of the failure modes of the transistors that fail under stress.

Constant current source circuits, such as circuit 10 shown in FIG. 2, are well known in the art for providing a source of constant current I from a voltage source 11 to a load 12. The circuit comprises an operational amplifier or "op amp" 14, with voltage input or $V_{in}$ 30, a field effect transistor (FET) 16, bipolar transistor 18 and a resistor 20 connected to an emitter node 24, and a precision resistor 22 of resistance R. A node 25 is connected to the drain of FET 16 and to the collector of transistor 18. Circuit 10 provides a constant current of $I=V_{in}/R$ to load 12.

When the positive (+, or non-inverting) input of an op amp is higher (in voltage) than the negative (−, or inverting) input, the voltage at the output goes up. Conversely, when the negative input is higher than the positive input, the output goes down. It can be seen in FIG. 2 that op amp 14 is connected in a negative feedback configuration. FET 16 and resistor 20 provide the base bias to transistor 18. When the output of op amp 14 increases, the base bias increases, causing transistor 18 to conduct more, increasing its current flow, thereby increasing the emitter voltage (at resistor 22). This increases the voltage at the negative input of op amp 14, causing its output to decrease. This negative feedback configuration causes op amp 14 to maintain the voltage at the emitter of transistor 18 equal to $V_{in}$. When in a negative feedback configuration, the output of an op amp will go to whatever voltage is necessary to maintain its inputs at equal voltages, as is well-known in the art.

Because the voltage at resistor 22, having a resistance R, is maintained at $V_{in}$, the current through resistor 22 is $I=V_{in}/R$. For all practical purposes, there is negligible current flow into op amp 14, and into the gate of FET 16. Therefore, the current in resistor 22 is equal to the current in the load 12. Because resistor 22 is of a precision resistance, and $V_{in}$ is set by an accurate voltage source, the load current can be set and maintained with precision.

Although circuit 10 is known in the art for providing a constant current to load 12, such a circuit is not ideal for use in stressing the bipolar transistor 18. Specifically, op amp 14 is intended to control the current through resistor 22, which is not the same as the emitter current. These currents differ by the current flowing through FET 16 and resistor 20. This differential current represents an error factor that will be different for each of the transistors being stressed, and that will change in magnitude over the course of the stress testing.

The present invention proposes an improved testing system and methodology that not only provide a true constant current to the transistor device under test, but also provide for constant voltage ($V_{ce}$), constant temperature, in situ data collection, and automatic device disconnect upon failure. The improved testing system and methodology further eliminate the need for physically handling the devices before the stress testing is complete. Thus, the improved testing system and methodology address needs that are not addressed by stress driver circuitry known in the art.

SUMMARY OF THE INVENTION

The present invention provides a stress-driver circuit for delivering a constant voltage ($V_{ce}$) and a constant current ($I=V_{in}/R$) to a bipolar transistor under stress. The circuit comprises a power source, an op-amp, a FET, the bipolar transistor, and first and second resistors. The power source is connected to the bipolar transistor collector and the drain of the FET. The op-amp has a positive input biased at an input voltage ($V_{in}$) and a negative input having a feedback loop connected the negative input. The feedback loop is connected to the bipolar transistor emitter. The op-amp output is connected to the FET gate. The FET drain is connected to the power supply, and the FET source is biased to ground through a first resistor and connected to the base of the bipolar transistor. The second resistor has a resistance R and is connected at one end to the bipolar transistor emitter and biased to ground at the other end.

An automatic trip circuit may be provided between the power source and a node to which the FET drain and the transistor device collector are connected. The automatic trip circuit is adapted to cut off power to the bipolar transistor and FET if the collector current of the bipolar transistor exceeds a predetermined limit. The automatic trip circuit may comprise logic that is optically isolated from the power supply current.

One or more parameter readout circuits each for providing a readout of current, voltage, or a combination of current and voltage may be provided in predetermined areas of the stress-driver circuit. The parameter readout circuits may be located, for example, to provide a readout of current to the bipolar transistor collector, current from the bipolar transistor emitter, current to the bipolar transistor base, voltage across the bipolar transistor collector and emitter, or a combination of these parameters. Each parameter readout circuit may comprises a precision resistor, an instrumentation amplifier, or a combination of these devices.

The automatic trip circuit may comprise a comparitor having a positive input connected to the reference voltage, a negative input connected to the collector current sense point, and an output; an optoisolator; a reset connected to the optoisolator; and a photovoltaic relay switch connected to the optoisolator, the power supply, and the bipolar transistor collector. The automatic trip circuit is adapted to function such that activation of the reset latches the optoisolator on, closing the photovoltaic relay switch to allow current to flow from the power supply to the bipolar transistor collector until the transistor collector current exceeds the predetermined limit and drives the comparitor low. This turns off the light emission from the LED in the optoisolator, causing power to be cut to the LED in the photovoltaic relay. This opens the photovoltaic relay switch and cuts off current flow from the power supply to the bipolar transistor collector. The reset may comprise a power-on-reset with clamp. Such an automatic trip circuit may be adapted to cut off power from a power supply to any predetermined device if a measured current exceeds a predetermined limit.

The invention also comprises a method for testing a bipolar transistor with the stress-driver circuit described above. The method comprises installing the bipolar transistor in the stress-driver circuit; supplying a constant voltage ($V_{ce}$) and constant current ($I=V_{in}/R$) to the transistor within the stress-driver circuit for a predetermined amount of time while exposing the transistor to a stress temperature; and evaluating the impact of current, voltage, time, and temperature on the transistor device. The method may further comprise an automatic trip circuit cutting off power to the bipolar transistor and the FET if a measured current of the bipolar transistor collector exceeds a predetermined limit. The method may still further comprise monitoring current, voltage, or a combination of current and voltage in one or more predetermined areas of the stress-driver circuit during the test using one or more parameter readout circuits.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. Included in the drawing are the following figures.

DETAILED DESCRIPTION OF INVENTION

Figure 1:
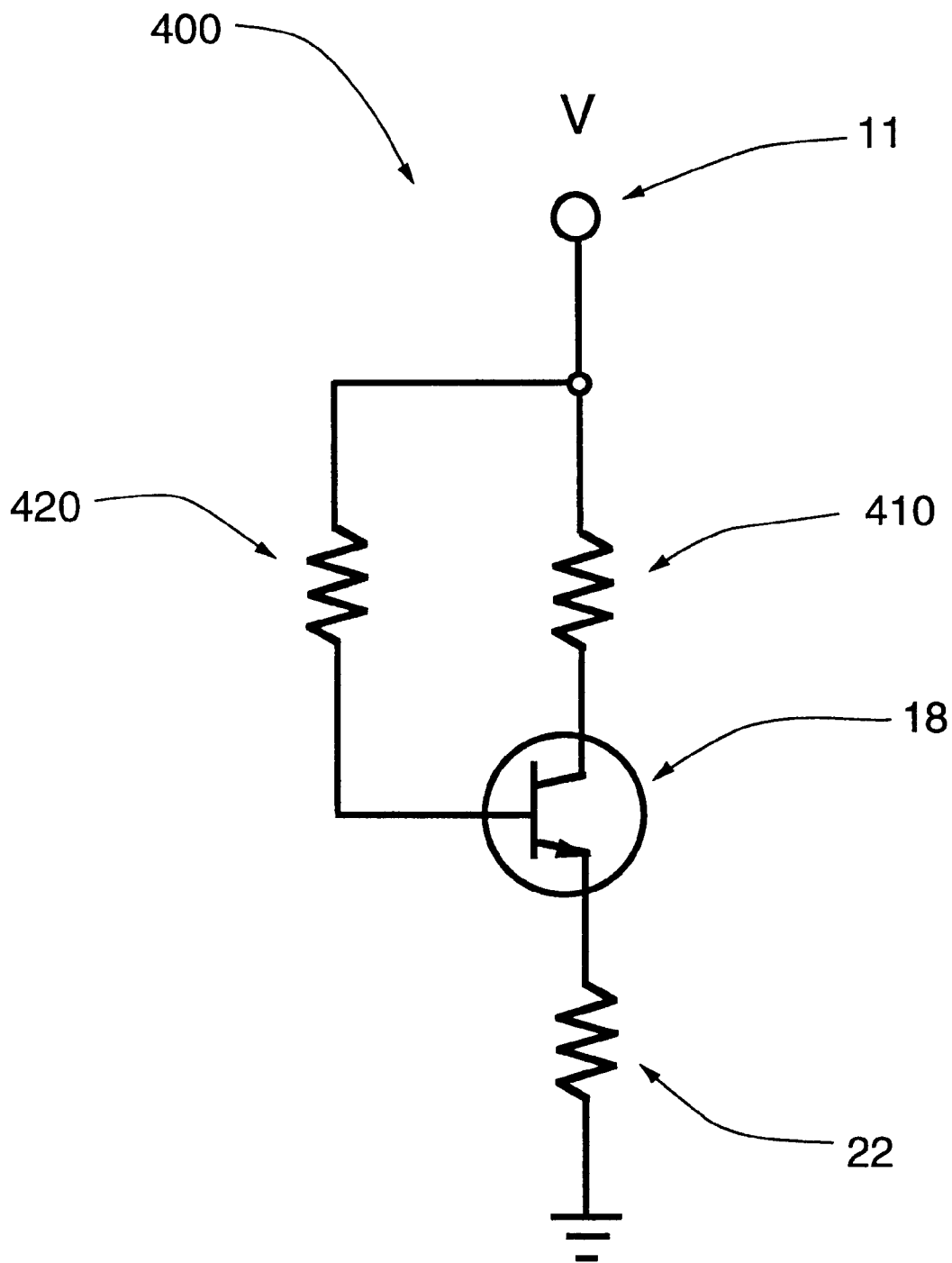
FIG. 1 is an electrical schematic diagram of a standard stress circuit known in the art.

Referring now to the drawing, in which like reference numbers refer to like elements throughout, FIGS. 3–6 schematically show the elements of the exemplary circuit according to the present invention. Such exemplary circuits may be used in a program called the Transistor Reliability Instrumentation And Stress System for Investigation and Characterization (TRIASSIC) program, and thus may be referred to as TRIASSIC stress-driver circuits. Typically, a plurality of such circuits are used together in an integrated system to test a plurality of circuits simultaneously.

Figure 3:
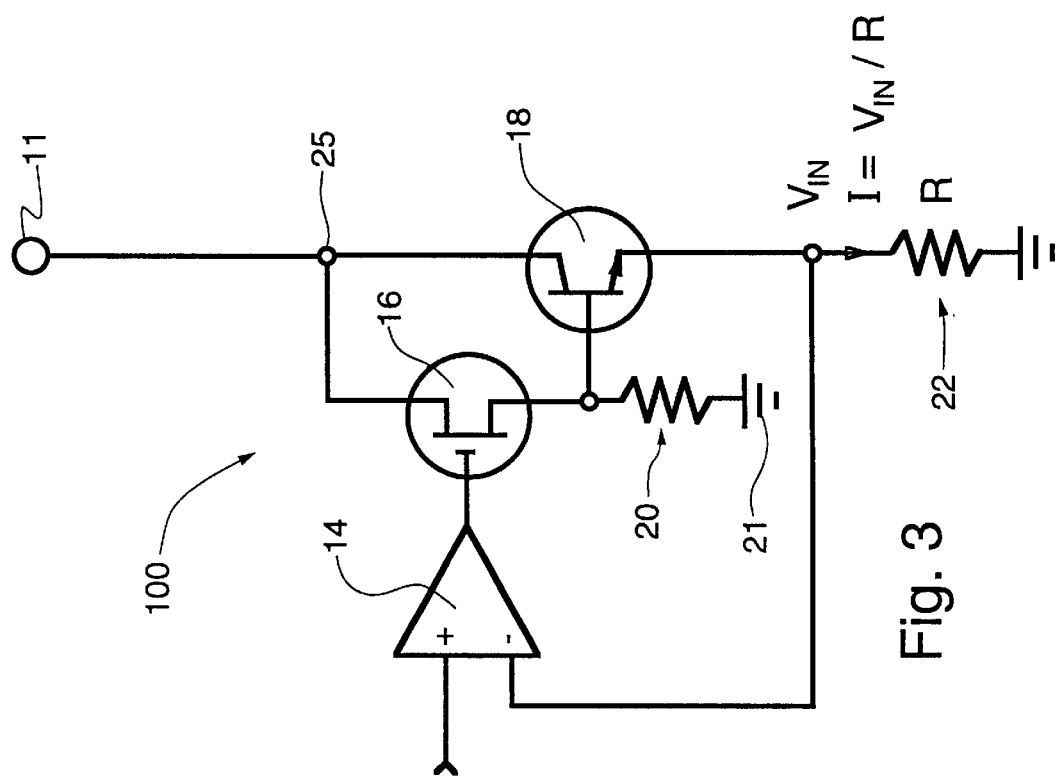
FIG. 3 is an electrical schematic diagram of an exemplary current source of the present invention showing a number of improvements over the circuit shown in FIG. 2 to allow control of voltage and current in a bipolar transistor under stress.
Figure 2:
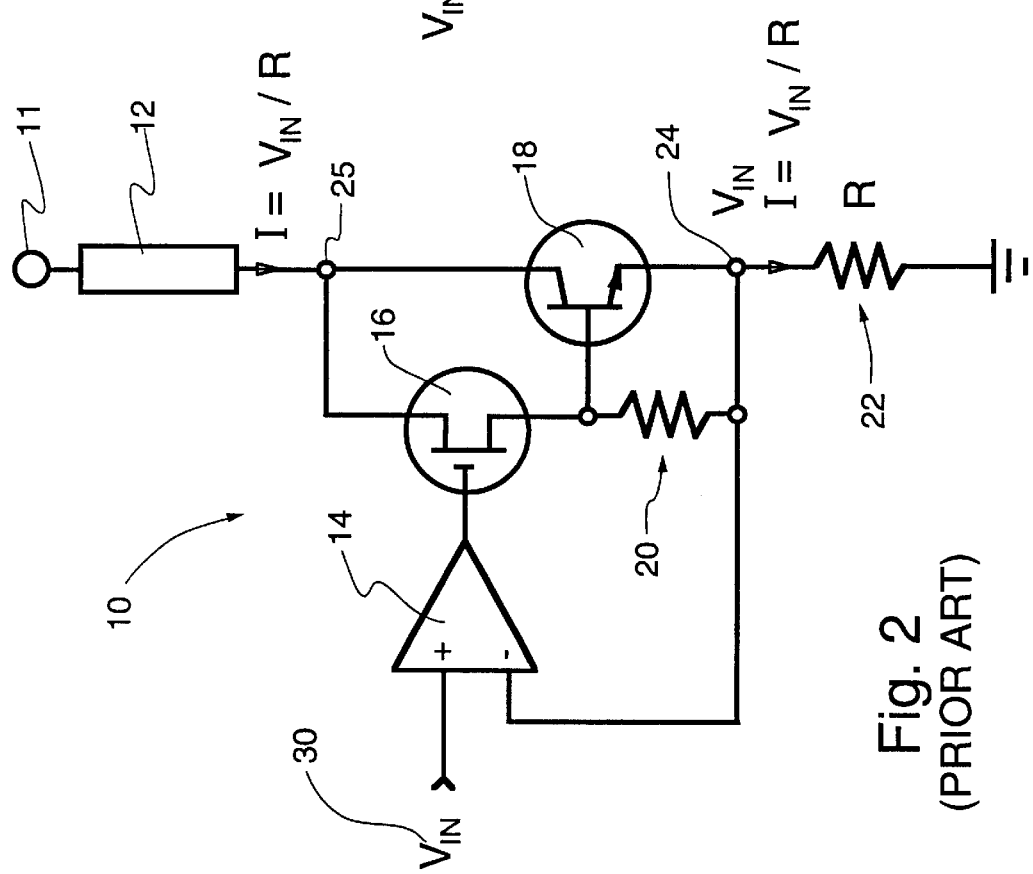
FIG. 2 is an electrical schematic diagram of a standard current source known in the art.

A comparison between constant current circuit 10 in FIG. 2 and the stress-driver circuit 100 in FIG. 3 illustrates a number of similarities and differences. First, there is no longer any load 12, because the purpose of the circuit is no longer to provide a current to the load, but rather to provide a constant emitter current $I=V_{in}/R$ to bipolar transistor 18. Accordingly, the load is unnecessary. Second, resistor 20 is now biased to ground 21 instead of being connected to emitter node 24. Biasing resistor 20 to ground keeps the emitter current constant in transistor 18.

The current in base bias elements 16 and 20 no longer sums with the emitter current as the currents flow into resistor 22. Instead, in circuit 100, because the current flow into the negative input of op amp 14 is negligible, the emitter current is equal to $V_{in}/R$ which is the same current that flows through resistor 22. Because $V_{in}$ is set by an accurate voltage source and resistor 22 is a precision resistor (typically 0.1% precision), the emitter current is set precisely. This change alone is a significant improvement over the prior art because it provides a truly constant, precise current to transistor 18.

FET 16, preferably a MOSFET, remains in circuit 100. Although FET 16 is no longer needed to provide a precise current to a load 12 as in the circuit of FIG. 2, the FET in circuit 100 is used to provide isolation of transistor 18 from the output of op-amp 14, assuring that the socket for transistor 18 is not "hot" (powered up) when the transistor is initially inserted. Op-amp 14 is preferably a precision op-amp (having a low offset voltage relative to $V_{in}$).

Figure 4:
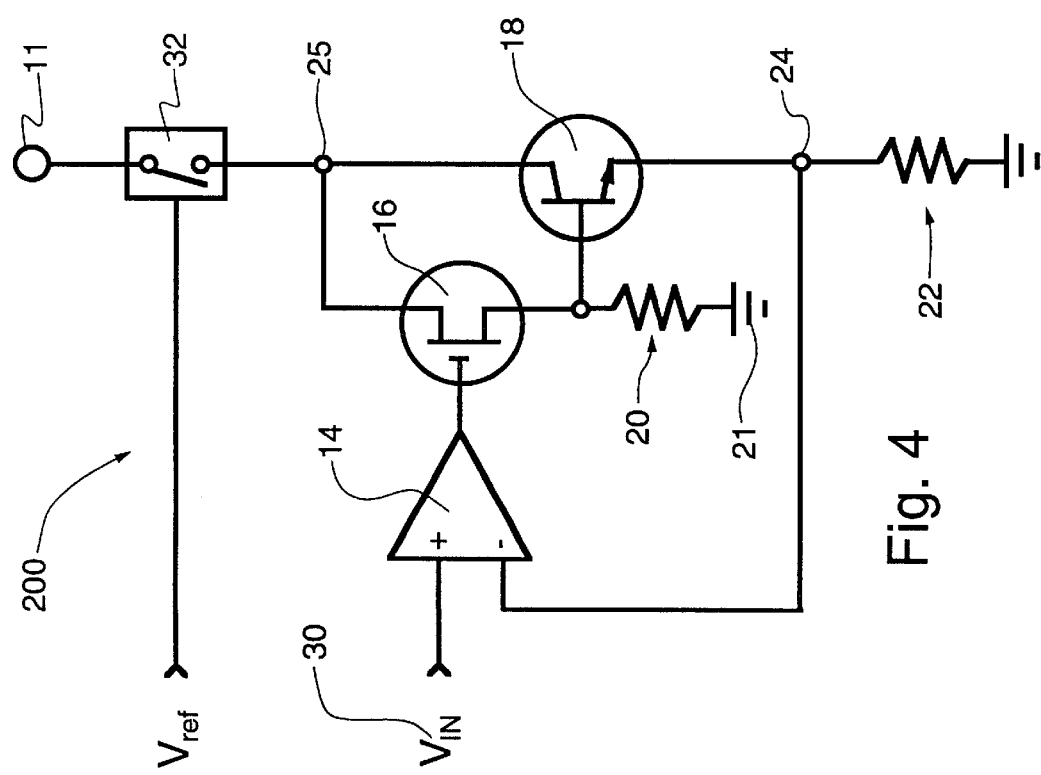
FIG. 4 is an electrical schematic diagram of an exemplary current source of the present invention showing an additional improvement over the circuit shown in FIG. 3, namely an automatic trip circuit.

Additional improvements are also shown in FIG. 4. The circuit 200 illustrated in FIG. 4 may preferably include an automatic trip circuit 32, which is detailed further in FIG. 6. Automatic trip circuit 32 is shown generally as a switch in FIG. 4 between power supply 11 and node 25 connected to the drain of FET 16 and collector of transistor 18. When automatic trip circuit 32 is open, no current can flow through transistor 18, even if FET 16 is conducting, because the collector, base, and emitter are then grounded via resistors 20 and 22.

Figure 5:
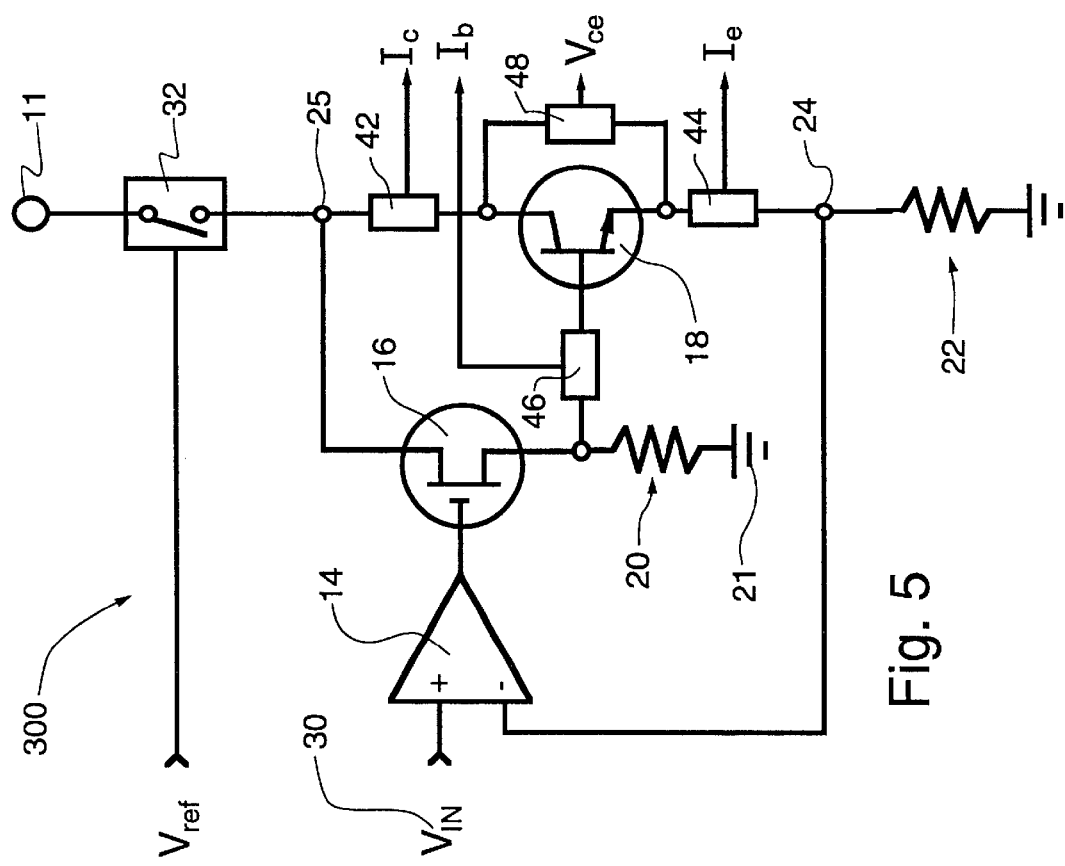
FIG. 5 is an electrical schematic diagram of an exemplary current source of the present invention having an automatic trip circuit and parameter readout circuits.
Figure 6:
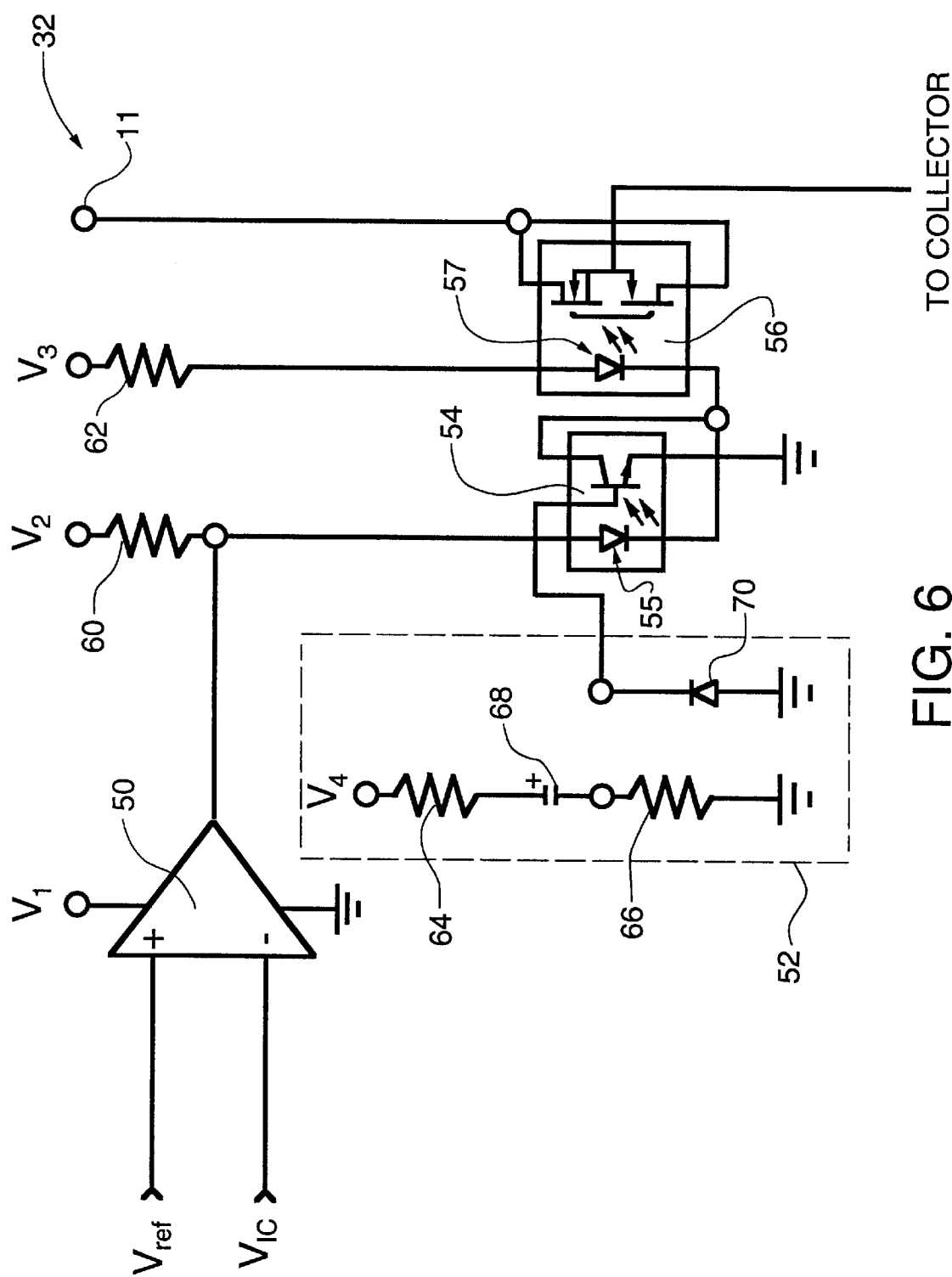
FIG. 6 is a detailed electrical schematic diagram of the exemplary automatic trip circuit shown in FIG. 4.

An exemplary embodiment of automatic trip circuit 32 is shown in greater detail in FIG. 6. This embodiment of automatic trip circuit 32 comprises a comparitor 50, a reset 52, an optoisolator 54, and a photovoltaic relay 56. Comparitor 50 compares a reference voltage $V_{ref}$ with a voltage $V_{ic}$ measured across the collector current sense resistor via an instrumentation amplifier 42 (see FIG. 5). Reset 52 as shown in FIG. 6 is a power-on-reset with clamp circuit, and provides initial power to optoisolator 54, which then stays latched on until the light-emitting diode or "LED" 55 goes out. As long as light is emitted by LED 55 and the LED 57, current can flow from power source 11 to transistor 18, shown in FIG. 5. If $V_{ic}$ exceeds $V_{ref}$, indicating that transistor 18 is drawing too much current, then the output of comparitor 50 goes to zero, turning off power to LED 55. The loss of light from LED 55 in turn stops current flow through and light emitted from LED 57, which then opens the switch to stop current flow from power source 11 to the collector of transistor 18.

The automatic trip circuit thus protects transistor 18 by disabling the device if the collector current exceeds a preset limit ($V_{ref}$). This protection prevents transistor 18 from "burning up" under a short circuit failure and preserves the stress-induced damage for physical failure analysis.

Although any type of automatic trip protection circuit may be used, the circuit described above has a number of advantages. First, the optical isolation provided by photovoltaic relay 56 isolates the operating voltage that operates automatic trip protection circuit 32 from the voltage 11 supplied to current-driver circuit 100. This isolation allows current-driver circuit 100 to be operated at standard analog circuit voltages (e.g., ±15V) while voltage 11 can be set to whatever voltage is necessary to provide the required stress voltage ($V_{ce}$) to bipolar transistor 18.

Second, the use of a power-on-reset with clamp circuit for reset 52 means that, once the test is initiated, a test operator cannot turn a particular stress-driver circuit back on if it is tripped off. Thus, a circuit that is tripped off will stay in the off position until the end of the test. Although other reset generators for providing initial power to the base of bipolar transistor 54 may be used, such as a manual switch or a computer pulse, the power-on-reset with clamp is a preferred embodiment. The power-on-reset with clamp circuit shown in FIG. 6 is merely one example of such a circuit, and other circuit designs may be used by one skilled in the art.

Automatic trip circuit 32 may be tailored to meet any particular application. The set of components shown therefore merely comprise a single embodiment, and the components may be modified, components subtracted, or other components added by one skilled in the art to fit a particular application without departing from the spirit of the invention.

Additional improvements are shown in FIG. 5. The circuit 300 illustrated may preferably include a plurality of parameter readback circuits 42, 44, 46, and 48, each of which may typically comprise a simple instrumentation amplifier for sensing voltage, or an instrumentation amp with a precision resistor for sensing current. For example, readback circuit 42 may provide a readout of transistor collector current IC, circuit 44 may provide a readout of transistor emitter current $I_e$, circuit 46 may provide a readout of transistor base current $I_b$, and circuit 48 may provide a readout of the voltage drop $V_{ce}$ across transistor 18. Readback circuits 42, 44, 46, and 48 may be placed anywhere in circuit 300, however, and thus where any two components are discussed as being "connected" to one another, that connection may be through another component such as one of the readback circuits.

The readback circuits for measuring current typically comprise a precision resistor (typically 0.1% precision) (not shown) and an instrumentation amplifier (not shown) that measures the voltage across that resistor, as are well known in the art. An instrumentation amplifier alone is adequate for measurement of voltage drop. The readouts of readback circuits 42, 44, 46, and 48 are typically connected through a multiplexer (not shown) to a digital volt meter (DVM) (not shown) and in turn to a data acquisition system (not shown), such as a computer, for monitoring each readout of each TRIASSIC circuit during testing. The multiplexer may allow sequencing of the signals from the instrumentation amplifiers to a single DVM for collection of the measurement data. The computer can control the selection of lines for readout and receive the data from the DVM for storage. The data may then be plotted and analyzed in real time for viewing certain failure criteria such as beta degradation and distribution.

The locations for the readback circuits shown in FIG. 5 are merely exemplary and are not intended to be limiting. Readback circuits may be placed anywhere on circuit 100 as desired to provide a readout of current, voltage, or a combination of current and voltage at a selected area of the circuit. Furthermore, a single such circuit in a single location may be provided as may any combination of such circuits. The output of circuit 42 provides the input to comparitor 50 ($V_{ref}$) in FIG. 6. v

EXAMPLE

The following list of components used in an exemplary stress-driver circuit embodiment is included to more clearly demonstrate one working embodiment, but is merely exemplary, not restrictive, of the invention. With reference to FIG. 6, comparitor 50 may comprise half of a 15-volt LM393, manufactured by National Semiconductor of Santa Clara, Calif. Optoisolator 54 may comprise an 4N38, manufactured by QT Optoelectronics of Sunnyvale, Calif. Photovoltaic relay 56 may comprise a PVG612 HEXFET® power MOSFET photovoltaic relay, manufactured by International Rectifier, of El Segundo, Calif. The schematics with respect to optoisolator 54 and relay 56 showing the internal workings and pin numbers for connection are per the recommendations of these specific manufacturers. Similar devices from other manufacturers may have different configurations, as may be well known in the art, and are likewise connected per the manufacturer's specification sheet. Furthermore, although referred to as "optoisolator" 54 and "photovoltaic relay" 56 consistent with the names used by the manufacturers of the specific devices described above, such devices may be referred to by different names by different manufacturers. The names used for such devices are not critical, as long as the devices provide the requisite functions.

Voltages $V_1$, $V_2$, $V_3$, and $V_4$ may each have a value of 15 volts. The resistor 60 may be a 330Ω resistor; resistor 62, a 1.5 kΩ resistor; resistor 64, a 470 kΩ resistor; and resistor 66, a 100 kΩ resistor. The diode 70 may be a 1N914 switching diode, and the capacitor 68 may have a value of 10 µf. Resistors, diodes, and capacitors are commonly available from a number of sources and manufacturers, as is well known in the art.

Exemplary precision op amps 14 in FIG. 5 include an OPA277, manufactured by Burr-Brown of Tucson, Ariz., or a MAX400, manufactured by Maxim Integrated Products, Inc., of Sunnyvale, Calif. The value of resistor 22 in FIG. 5 is dictated entirely by the stress current to be applied to bipolar transistor 18. The instrumentation amp for use in each of readback circuits 42, 44, 46, and 48 may comprise an INA121, manufactured by Burr-Brown. Resistor 20 in FIG. 5 may have a value of 51 kΩ. Voltage 11 will be of a value to provide the constant stress voltage to transistor 18. For example, as shown in FIG. 3, voltage 11 is equal to $V_{in}+V_{ce}$.

For all of the above part numbers and manufacturers, a number of manufacturers may make similar parts under the same or different part numbers. The part numbers and manufacturers listed above are merely provided to give one source of these components.

Testing of transistors using the TRIASSIC system typically comprises placing the 72 stress-driver circuits, with transistors installed, in an oven which provides a predetermined stress temperature above or below ambient temperature, and exposing the transistors to a current, typically between 0.5 mA and 200 mA, for a predetermined amount of time, typically on the order of several hundred to a few thousand hours. A multiplexer hooked up with one level of multiplexing providing sequencing among the four readback signals and another level of multiplexing providing sequencing among the seventy-two stress-driver circuits typically provide the measurement points to a DVM. The measurement by the DVM is then logged by a computer on an ongoing basis as the test proceeds.

In an exemplary prototype system, the plurality of seventy-two circuits were divided into thirds, allowing three different sets of stress conditions ($V_{ce}$, I=$V_{in}$/R) to be applied to three sets of twenty-four transistors simultaneously. Accordingly, the plurality of circuits may be divided into any number of subsets as desired to allow multiple sets of stress conditions to be applied simultaneously at the same temperature for the same duration.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A stress-driver circuit for providing a constant voltage ($V_{ce}$) and a constant current (I=$V_{in}$/R) to a bipolar transistor under test, the bipolar transistor having a base, a collector, and an emitter, the circuit comprising:
    a power source connected to the bipolar transistor collector;
    an op-amp having a positive input, a negative input, and an output, the positive input biased at an input voltage ($V_{in}$) and the negative input having a feedback loop connected thereto, the feedback loop connected to the bipolar transistor emitter;
    a field effect transistor (FET) having a gate connected to the op-amp output, a drain connected to the power supply, and a source biased to ground through a first resistor and connected to the base of the bipolar transistor; and
    a second resistor having a resistance and having a first end and a second end, the first end connected to the bipolar transistor emitter and the second end biased to ground.

2. The stress-driver circuit of claim 1 further comprising an automatic trip circuit between the power source and a node to which the FET drain and the transistor device collector are connected, the automatic trip circuit adapted to cut off power to the bipolar transistor and FET if a current at the bipolar transistor collector exceeds a predetermined value.

3. The stress-driver circuit of claim 2 wherein the automatic trip circuit comprises logic that is optically isolated from the power supply current.

4. The stress-driver circuit of claim 3 further comprising an instrumentation amp that measures the transistor collector current and wherein the automatic trip circuit comprises:
    a comparitor having a positive input connected to the reference voltage, a negative input connected to the transistor collector current instrumentation amp, and an output;
    an optoisolator with a first light-emitting diode (LED);
    a reset connected to the optoisolator; and
    a photovoltaic relay switch comprising a second LED, connected to the optoisolator, the power supply, and the bipolar transistor collector;

wherein the automatic trip circuit is adapted to function such that activation of the reset latches the optoisolator on, closing the photovoltaic relay switch to allow current to flow from the power supply to the bipolar transistor collector until the transistor collector voltage exceeds the reference voltage and drives the comparitor low, turning off a light emission from the first LED, causing power to be cut to the second LED and thus opening the photovoltaic relay switch and cutting off current flow from the power supply to the bipolar transistor collector.

5. The stress-driver circuit of claim 4 wherein the reset comprises a power-on-reset with clamp.

6. The stress-driver circuit of claim 1 further comprising one or more parameter readout circuits each for providing a readout of current, voltage, or a combination thereof in a predetermined area of the stress-driver circuit.

7. The stress-driver circuit of claim 6 wherein at least one parameter readout circuit is positioned to provide a readout of a parameter selected from the group consisting of current to the bipolar transistor collector, current from the bipolar transistor emitter, current to the bipolar transistor base, voltage across the bipolar transistor collector and emitter, or a combination thereof.

8. The stress-driver circuit of claim 6 wherein each parameter readout circuit comprises a precision resistor, an instrumentation amplifier, or a combination thereof.

9. The stress-driver circuit of claim 6 further comprising an automatic trip circuit between the power source and a node to which the FET drain and the bipolar transistor collector are connected, the automatic trip circuit adapted to cut off power to the bipolar transistor and FET if a current at the bipolar transistor collector exceeds a predetermined value.

10. The stress-driver circuit of claim 9 wherein the automatic trip circuit comprises logic that is optically isolated from the power supply current.

11. The stress-driver circuit of claim 10 wherein the automatic trip circuit comprises:

a comparitor having a positive input connected to the reference voltage, a negative input biased at the transistor collector voltage, and an output;

an optoisolator with a first light-emitting diode (LED);

a reset connected to the optoisolator; and a photovoltaic relay switch comprising a second LED, connected to the optoisolator, the power supply, and the bipolar transistor collector;

wherein the automatic trip circuit is adapted to function such that activation of the reset latches the optoisolator on, closing the photovoltaic relay switch to allow current to flow from the power supply to the bipolar transistor collector until the transistor collector voltage exceeds the reference voltage and drives the comparitor low, turning off a light emission from the first LED, causing power to be cut to the second LED and thus opening the photovoltaic relay switch and cut off current flow from the power supply to the bipolar transistor collector.

12. The stress-driver circuit of claim 11 wherein the reset comprises a power-on-reset with clamp.

13. The stress-driver circuit of claim 1 wherein the FET is a MOSFET.

14. A stress-driver circuit for providing a constant voltage ($V_{ce}$) and a constant current ($I=V_{in}/R$) to a bipolar transistor under test, the bipolar transistor having a base, a collector, and an emitter, the circuit comprising:

a power source connected to the bipolar transistor collector;

an op-amp having a positive input, a negative input, and an output, the positive input biased at an input voltage ($V_{in}$) and the negative input having a feedback loop connected thereto, the feedback loop connected to the bipolar transistor emitter;

a field effect transistor (FET) having a gate connected to the op-amp output, a drain connected to the power supply, and a source biased to ground through a first resistor and connected to the base of the bipolar transistor; and a second resistor having a resistance and having a first end and a second end, the first end connected to the bipolar transistor emitter and the second end biased to ground;

one or more parameter readout circuits positioned to provide a readout of a parameter selected from the group consisting of current to the bipolar transistor collector, current from the bipolar transistor emitter, current to the bipolar transistor base, voltage across the bipolar transistor collector and emitter, or a combination thereof; and an automatic trip circuit between the power source and a node to which the FET drain and the bipolar transistor collector are connected, the automatic trip circuit adapted to cut off power to the bipolar transistor and the FET if a current at the transistor collector exceeds a predetermined value.

15. The stress-driver circuit of claim 14 wherein the automatic trip circuit comprises logic that is optically isolated from the power supply current.

* * * * *